United States Patent [19]

Kobayashi et al.

[11] Patent Number: 4,614,934

[45] Date of Patent: Sep. 30, 1986

[54] DIGITAL-TO-ANALOG CONVERTER DEVICE FOR PROCESSING PCM SIGNALS OF DIFFERENT SAMPLING FREQUENCIES

[75] Inventors: Masaharu Kobayashi; Takaharu Noguchi, both of Yokohama; Keizo Nishimura, Yokosuka; Hiromichi Tanaka, Yokohama; Masami Nishida, Yokohama; Takao Arai, Yokohama, all of Japan

[73] Assignee: Hitachi, Ltd., Tokyo, Japan

[21] Appl. No.: 578,787

[22] Filed: Feb. 10, 1984

[30] Foreign Application Priority Data

Mar. 14, 1983 [JP] Japan .................................. 58-40658

[51] Int. Cl.⁴ ............................................. H03M 1/66
[52] U.S. Cl. ................................ 40/347 DA; 370/119; 328/151
[58] Field of Search .................. 40/347 DD, 347 DA; 370/119, 112; 328/151; 307/352, 353

[56] References Cited

U.S. PATENT DOCUMENTS

| 1,772,165 | 8/1930 | Taylor et al. | 370/119 |
| 4,005,276 | 1/1977 | Abramson et al. | 370/119 |
| 4,271,508 | 6/1981 | Schenk | 370/112 |
| 4,477,900 | 10/1984 | Gruenberg | 370/112 |

OTHER PUBLICATIONS

Application of Real Time Convolution for Audio Equipments Papers of Acoustical Society of Japan 10/78, pp. 247–248, Yamasaki et al.

Primary Examiner—Bernard Roskoski
Attorney, Agent, or Firm—Antonelli, Terry & Wands

[57] ABSTRACT

A digital-to-analog converter device for PCM signals at different sampling frequencies comprises a signal converter which expands the frequency distance between a PCM signal band and a side band by converting the sampling frequencies associated with the PCM signals to be reproduced into higher frequencies. With this signal converter, a single low-pass filter can be simplified, having a gradual ramp cut-off characteristic for removal of the side band wherein a pass band cut-off frequency and a stop band cut-off frequency can be adapted for low pass filtering of the PCM signals at different sampling frequencies.

10 Claims, 11 Drawing Figures

POINT (A)

FREQUENCY

DIGITAL-TO-ANALOG CONVERTER DEVICE FOR PROCESSING PCM SIGNALS OF DIFFERENT SAMPLING FREQUENCIES

This invention generally relates to PCM (Pulse Code Modulation) systems and more particularly to a digital-to-analog converter device suitable for a PCM system wherein PCM signals at different sampling frequencies are converted into analog signals.

A prior art digital-to-analog converter circuit will be described with reference to a schematic diagram as shown in FIG. 1 and a characteristic diagram as shown in FIG. 2. A PCM signal 1 is converted into an analog signal 3 by means of a digital-to-analog converter (DAC) 2. The analog signal 3 is filtered by a low-pass filter 4 to produce an output signal 5. The low-pass filter 4 used herein will be described in greater detail with reference to FIG. 2.

A spectrum of the analog signal 3 is exemplified at section (a) in FIG. 2, where $f_s$ designates a sampling frequency. While the signal spectrum covers frequencies ranging from 0 (zero) to $f_s/2$, a side band component for the sampling frequency $f_s$ ranges from $f_s-f_s/2$ to $f_s+f_s/2$. Since the side band component must be removed from the output signal, the low-pass filter is needed.

The low-pass filter thus requires a characteristic as exemplified at (b) in FIG. 2 and with this filter, an output signal as shown at (c) in FIG. 2 can be obtained. Practically, however, it is difficult for the filter to have such an abrupt attenuation characteristic and hence the signal frequency band is set to below half the sampling frequency $f_s$, for example, to 20 KHz in the case of a so-called compact disc wherein the sampling frequency is 44.1 KHz, and the filter is designed to have a pass band cut-off frequency $f_c$ of 20 KHz as shown at (d) in FIG. 2.

However, when considering the efficiency of sound signals, a narrowed signal band faces a problem that high-fidelity signal reproduction is prevented. In addition, when the bit number for quantization is increased, an abrupt cut-off characteristic is required. For these reasons, the design of the low-pass filter becomes complicated.

A construction as shown in FIG. 3, which is designed to simplify the low-pass filter using a digital filter, is known from, for example, Japanese literatures, Yamasaki et al "Application of Real Time Convolution for Audio Equipments" in papers of Acoustical Society of Japan, Oct. 1978, pp 247–248 and Yamasaki et al "PCM Digital Audio" published by Seibundo Shinko-sha, Nov. 1980, pp 121–124.

In FIG. 3, a PCM signal 1, as used in, for example, a space satellite broadcasting system, is subjected to conversion of its sampling frequency $f_s$ and band filtering by means of a signal converter 6. An output signal 7 from the signal converter 6 is converted into an analog signal 3 by means of a digital-to-analog converter 2. The analog signal 3 is filtered at a low-pass filter 4 to produce an output signal 5. In the broadcasting satellite specifications in Japan, the audio broadcast mode A has an audio signal transmission band of 15 KHz, a sampling frequency of 32 KHz and a quantization and compander rate of 14/10 bits and the B mode has 20 KHz, 48 KHz and 16 bits.

The principle of the digital-to-analog converter device shown in FIG. 3 will now be described with reference to FIG. 4 showing the operation thereof when the signal converter 6 is constituted by, for example, a digital filter.

The PCM signal 1 has a frequency spectrum as shown at section (a) in FIG. 4. A signal component covering a frequency band $f_s/2$ is sampled at a sampling frequency $f_s$. The sampling frequency of this signal e.g., 32 KHz is converted into $f_s'$ e.g., 64 KHz, providing a frequency spectrum as shown at (b) in FIG. 4. Signal components above the $f_s/2$ band are subjected to low-pass filtering by means of the signal converter 6, providing a frequency spectrum as shown at (c) in FIG. 4. The output signal 7 of the signal converter 6 has therefore this frequency spectrum.

The output signal 7 is converted into the analog signal by the digital-to-analog converter 2 and passed through the filter 4 having a low-pass characteristic as shown at (d) in FIG. 4, thus providing a characteristic as shown at (e) in FIG. 4.

It will be appreciated from the above description that if the PCM signal having the frequency spectrum shown at (a) in FIG. 4 is simply converted into an analog signal, then a low-pass filter having an abrupt cut-off characteristic indicated by the dotted line as shown at (d) in FIG. 4 is needed whereas, when the PCM signal having the frequency spectrum shown at FIG. 4(c) is converted into an analog signal, a low-pass filter suffices which has a chained line cut-off characteristic as shown at FIG. 4(d) wherein the pass band cut-off frequency occurs at $f_s/2$ and the stop band cut-off frequency occurs at $f_s'-(f_s/2)$.

In this case, the digital-to-analog converter 2 must be so designed as to respond to the sampling frequency $f_s'$.

Further, the ramped band cut-off characteristic of the low-pass filter 4 becomes more gradual as the sampling frequency $f_s'$ increases with respect to the sampling frequency $f_s$.

However, in a satellite braodcasting system using the SHF band available in Japan, a PCM signal at a single standard frequency is not employed, but one PCM signal covering a 15 KHz band which is sampled at a sampling frequency of 32 KHz for 4-channel sounds and the other PCM covering a 20 KHz band which is sampled at a sampling frequency of 48 KHz for 2-channel sounds are switched in a time series so as to be broadcast. In transmitting a plurality of PCM signals at different sampling frequencies as described above, separate low-pass filters adapted for the respective PCM signals must be prepared if the prior art technical idea is applied by itself.

An object of this invention is to provide a digital-to-analog converter device with a single low-pass filter which can ensure low-pass filtering for a plurality of PCM signals at different sampling frequencies which are received in a time series.

To accomplish the above object, according to this invention, a signal converter is provided which expands the frequency distance between a PCM signal band and a side band by converting at least one of the different sampling frequencies into a predetermined frequency e.g., a higher frequency. With this signal converter, a low-pass filter can be simplified, having a gradual ramp cut-off characteristic for removal of the side band wherein a pass band cut-off frequency and a stop band cut-off frequency can be adapted for low-pass filtering of the plurality of PCM signals at different sampling frequencies.

Figure 5:
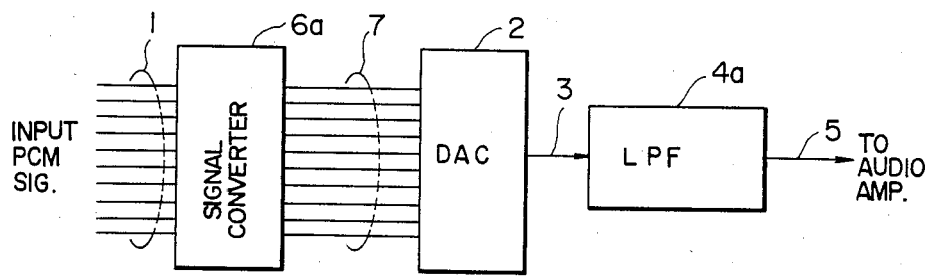
Figure 6:
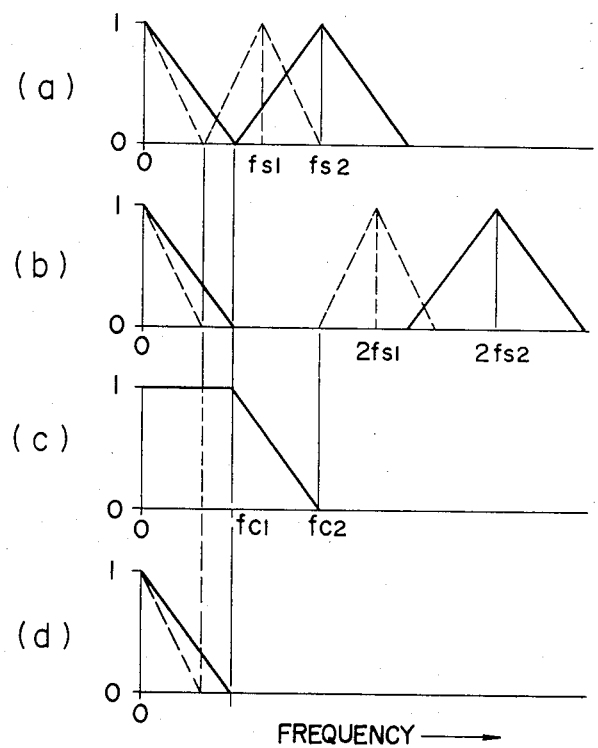
Figure 7:
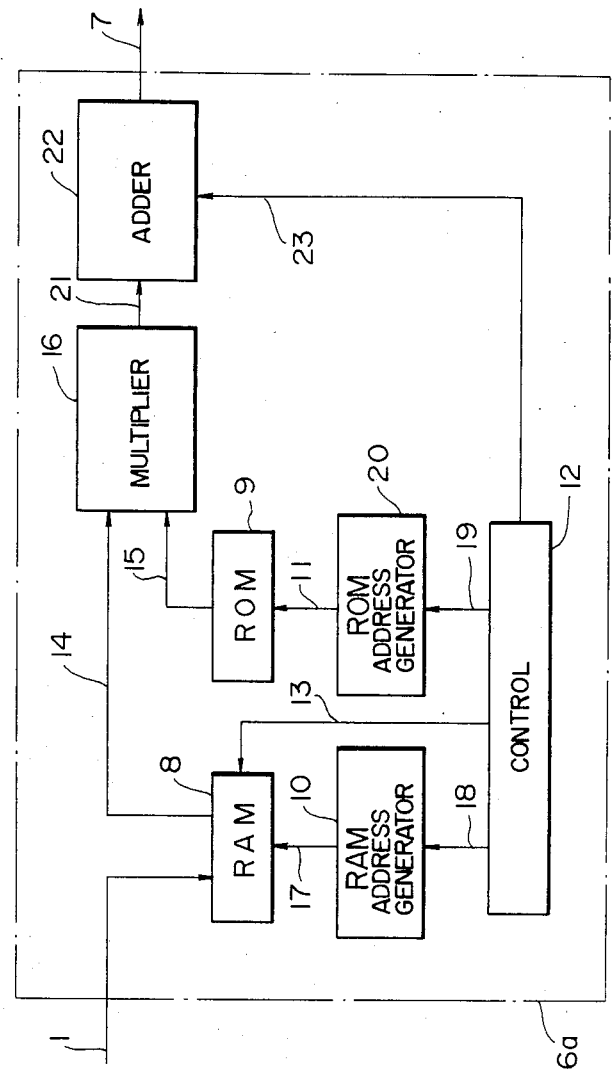
Figure 8:
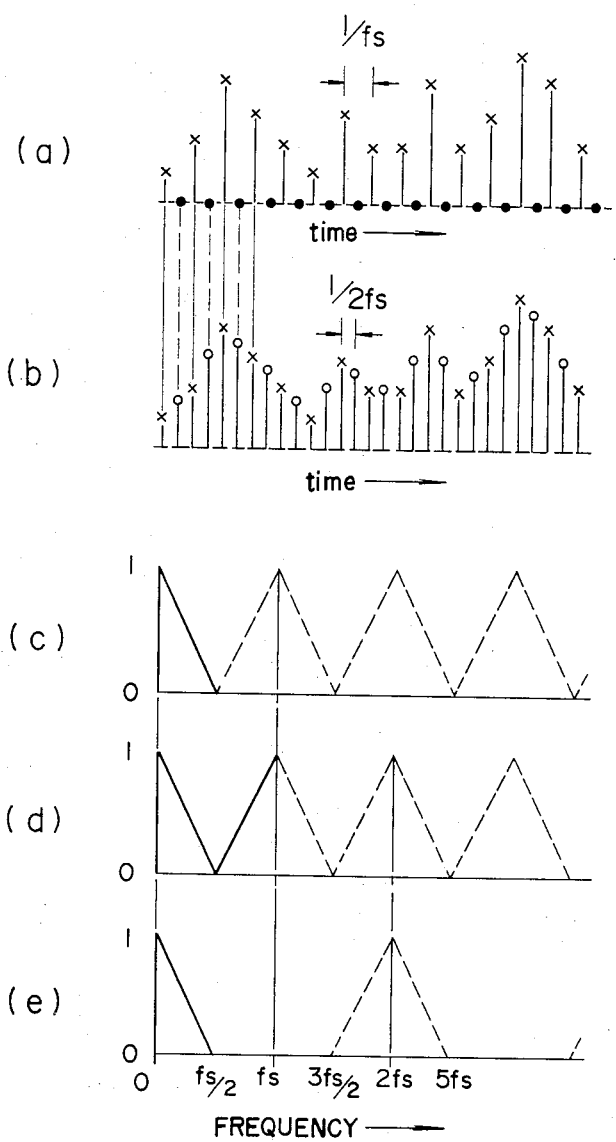
Figure 9:
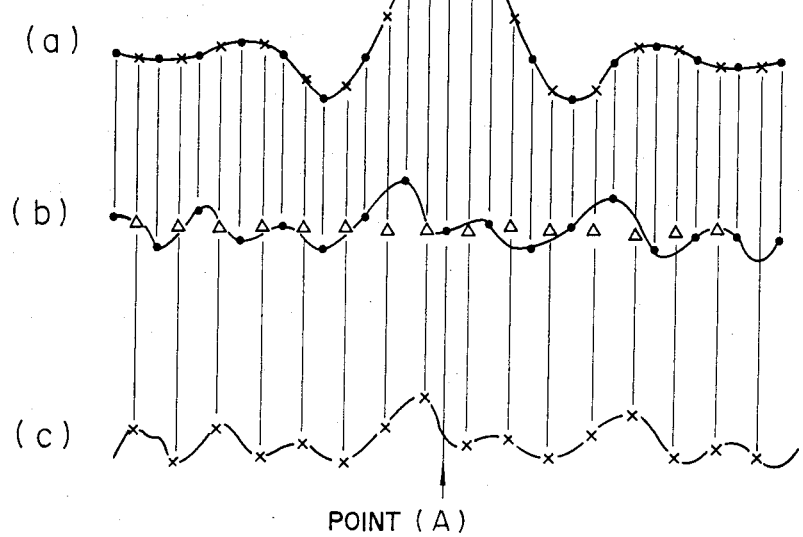
Figure 10:
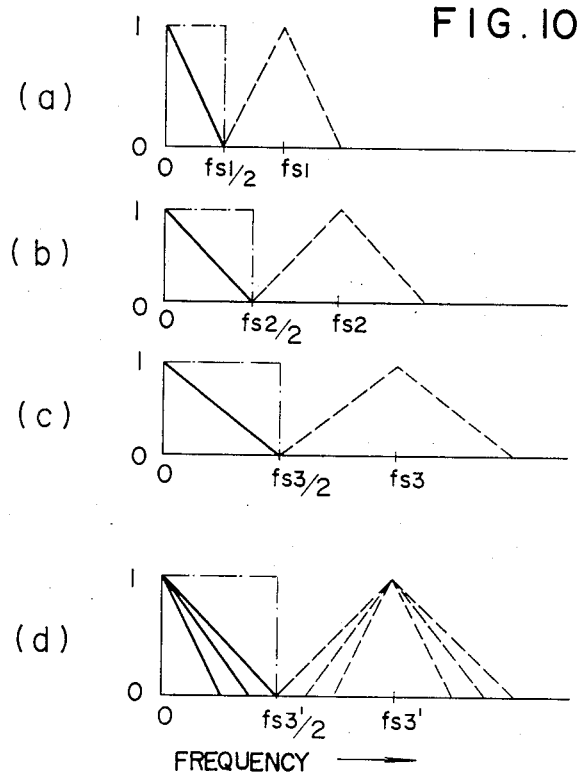
Figure 11:
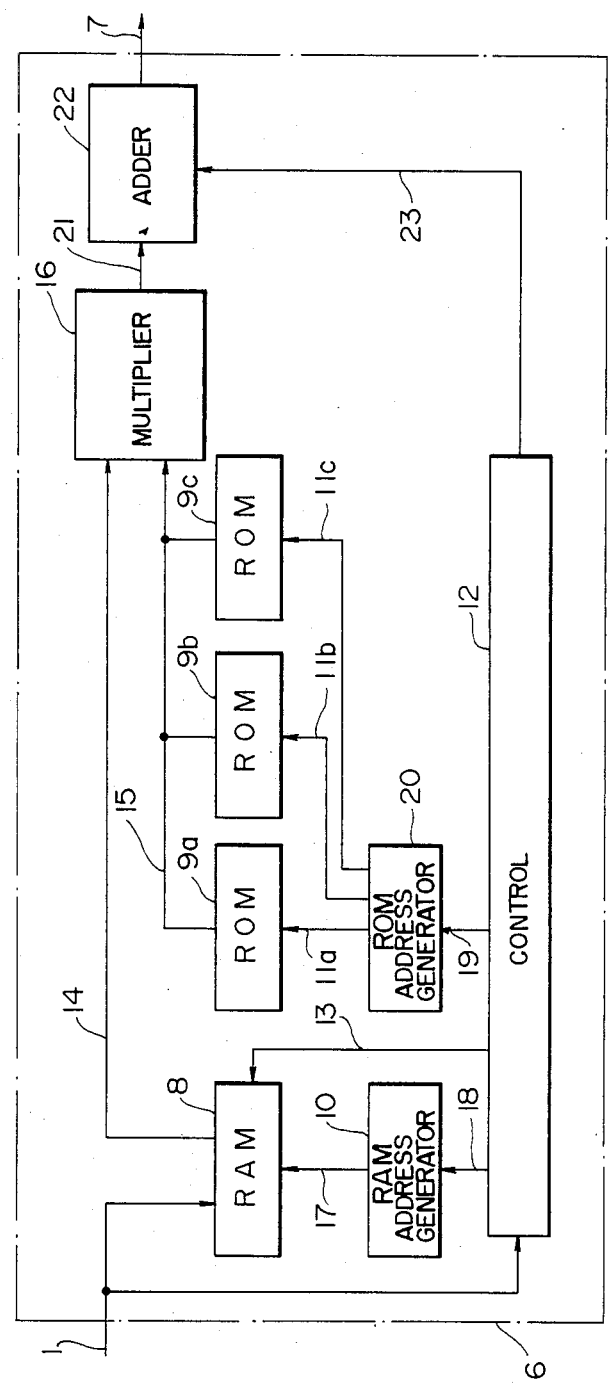

FIG. 5 schematically shows a digital-to-analog converter device according to one embodiment of this invention;

FIG. 6 shows frequency spectra exemplified in the FIG. 5 device;

FIG. 7 is a block diagram of a signal converter 6a in the device of FIG. 5;

FIG. 8 shows the relation between data and frequency spectra;

FIG. 9 shows the relation between data and coefficient;

FIG. 10 shows frequency spectra when the number of sampling frequencies is three; and FIG. 11 is a block diagram of another signal converter according to this invention.

Referring now to FIG. 5, one embodiment of a digital-to-analog converter device according to this invention is schematically shown in block form.

The operational principle for converting the sampling frequency of a PCM signal by means of the FIG. 5 device will now be described with reference to FIG. 6 on the assumption that two PCM signals at two different sampling frequencies are processed.

Two different PCM signals at sampling frequencies $f_{s1}$ and $f_{s2}$ have frequency spectra as shown at section (a) in FIG. 6. These two PCM signals as designated at reference numeral 1 are supplied to a signal converter 6a of FIG. 5 in a time series.

In FIG. 6, signal frequency bands associated with sampling frequencies $f_{s1}$ and $f_{s2}$ are illustrated by dotted line and solid line, respectively.

Figure 1:
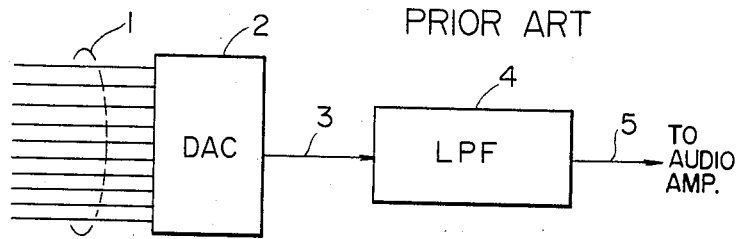
FIG. 1 is a schematic diagram showing a prior art digital-to-analog converter device.
Figure 2:
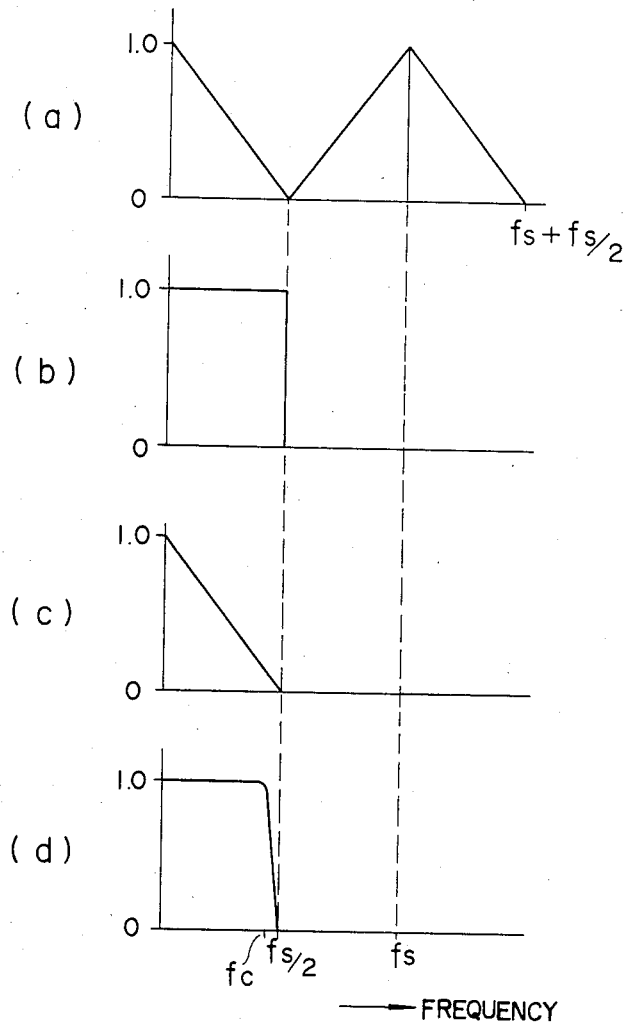
FIG. 2 shows frequency spectra in the device of FIG. 1.
Figure 3:
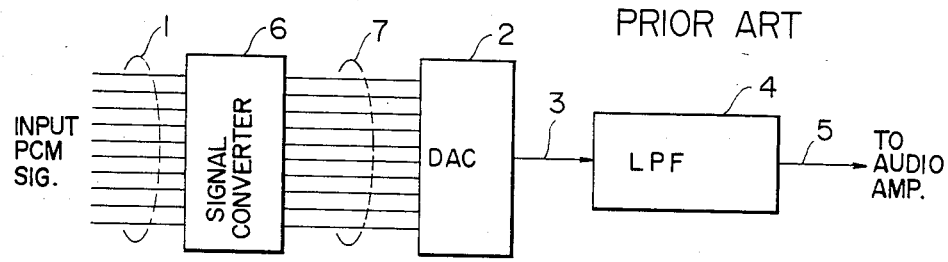
FIG. 3 is a schematic diagram showing another prior art digital-to-analog converter device.
Figure 4:
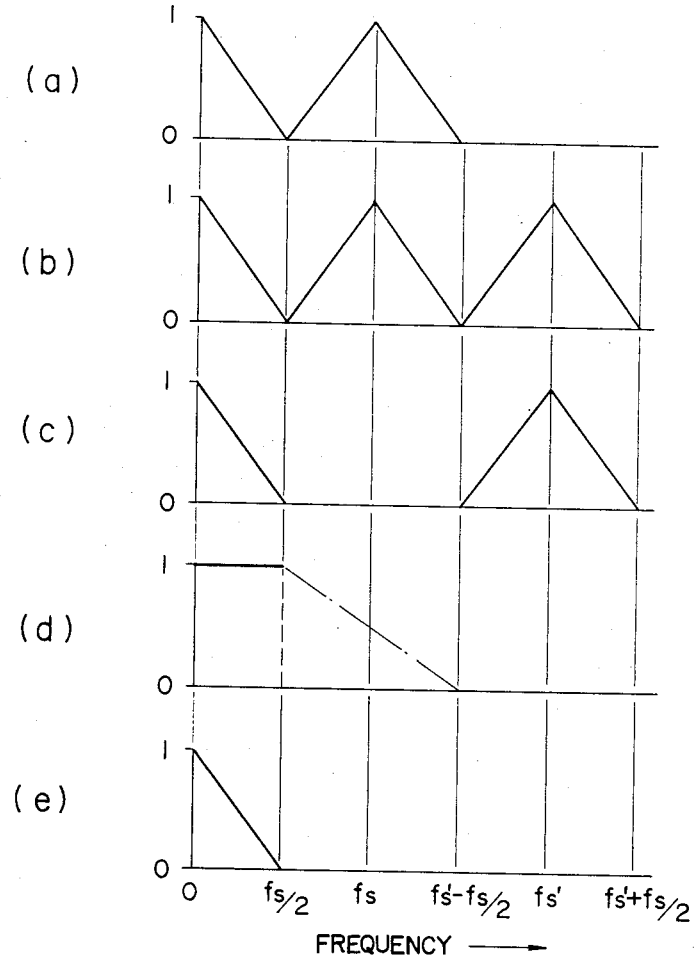
FIG. 4 shows frequency spectra in the device of FIG. 3.

When the sampling frequencies of the PCM signals are doubled by means of the signal converter 6a shown in FIG. 5 and these PCM signals are low-pass filtered at a digital filter, included in the signal converter 6a, which has low-pass bands corresponding to half the respective sampling frequencies, frequency spectra as shown at (b) in FIG. 6 are obtained. Then, the PCM signals associated with the frequency spectra shown at FIG. 1(b) are converted into analog signals by means of a digital-to-analog converter 2 and passed through a common low-pass filter 4a having filtering characteristics as shown at FIG. 6(c) to produce output signals associated with frequency spectra as shown at FIG. 6(d). For example, when the sampling frequency $f_{s1}$ is 32 KHz with the corresponding signal band being 15 KHz and the sampling frequency $f_{s2}$ is 48 KHz with the corresponding signal band being 20 KHz, the common low-pass filter 4a has a pass band cut-off frequency $f_{c1}$ of 20 KHz and a stop band cut-off frequency $f_{c2}$ of 49 KHz. Therefore, in response to one PCM signal associated with the sampling frequency $f_{s1}$, a desired output signal indicated by the dotted line as shown at (d) in FIG. 6 can be obtained and for the other PCM signal at the sampling frequency $f_{s2}$, a desired output signal indicated by the solid line as shown at FIG. 6(d) can be obtained.

To detail the signal converter 6a, it will be appreciated that this converter fulfils a duplex function including the conversion of the sampling frequencies for the input PCM signals into higher frequencies and the low-pass filtering of the signal bands as has been described previously with reference to FIG. 6.

To this end, a digital filter may be used. In order to cause the digital filter to perform low-pass filtering calculations, the input sampled data is used when sampling points after the conversion coincide with sampling points of the data but when the coincidence disappears, intermediate points in time between the sampling points after the conversion are added with zero. Thus, through such a digital filter, PCM signals at converted sampling frequencies each having a desired signal band can be obtained.

For example, the sampling frequency of the PCM signal can be doubled by inserting one zero data between adjacent input sampled data. The filter of the type described above may be constituted by memories, multipliers and an adder.

Turning to FIG. 7, an embodiment of the signal converter 6a in the form of an FIR (Finite Impulse Response) type digital filter will be described. PCM signals 1 are sequentially recorded in a random access memory (RAM) 8. The recording is carried out in a so-called cyclic fashion such that old data is rewritten over new data each time the RAM overflows.

A write address is determined by a RAM address signal 17 generated from a RAM address generator 10 which is controlled by a RAM address control signal 18 generated from a control circuit 12. Concurrently, the RAM 8 is so controlled by the RAM control signal 13 as to start recording and reading.

Subsequently, the RAM 8 is controlled by the RAM address signal 17 and RAM control signal 13 so that a recorded signal is read out of the RAM 8 to produce a read output signal 14.

On the other hand, a read only memory (ROM) 9 produces an output data 15 from address determined by a ROM address signal 11 generated from a ROM address generator 20 which is controlled by a ROM address control signal 19 generated from the control 12. The RAM output signal 14 and the ROM output signal 15 are multiplied by a multiplier 16 to produce a multiplied output signal 21. In effect, successive RAM output signals 14 and successive ROM output signals 15 are multiplied by the multiplier 16 to produce successive multiplied output signals 21 which, in turn, are added together by an adder 22 to produce a signal converter output signal 7. The adder 22 sequentially adds the data during a predetermined interval which is controlled by an adder control signal 23.

With this contruction, a filtering characteristic of the digital filter is provided which is determined by coefficients recorded in the ROM 9 and the capacity of the RAM 8 and ROM 9.

As well known in the art, the cut-off characteristic of the digital filter serving as a low-pass filter depends on the accuracy of the coeffients and the number of data to be calculated. A desired characteristic adapted for ordinary PCM reproducing systems can be obtained with a data number which measures about one hundred and several of tens.

FIG. 8 is useful for explaining the operation of the FIG. 7 signal converter. An amplitude distribution of the data sampled at the sampling frequency $f_s$ is depicted at section (a) in FIG. 8, where "X" marks are used to represent amplitudes (sampled values of input PCM data) at sampling times. The input PCM data is sampled at a sampling frequency of 2 $f_s$, whereby the data sampled at the sampling frequency $f_s$ is added with data of zero amplitude at the middle point of the time interval between adjacent sampling points pursuant to the sampling frequency $f_s$. Thus, a distribution of FIG. 8(b) with a sampling period of $\frac{1}{2} f_s$ is produced. A frequency band component corresponding to the amplitude distribution shown at (a) in FIG. 8 is illustrated at FIG. 8(c), and a frequency band component corresponding to the sampling at the 2 $f_s$ sampling frequency is illustrated at FIG. 8(d).

The data thus sampled at the 2 $f_s$ sampling frequency is filtered through the digital filter so that a signal band of above $f_s/2$ is removed, thus providing a signal as shown at (b) in FIG. 8. A frequency band component corresponding to the signal shown at (b) of FIG. 8 is illustrated at (e) of FIG. 8. The added data which is at the center of the original sampling interval is illustrated by marking the samples with "o" as shown at (b) in FIG. 8. The thus obtained signal is associated with the doubled sampling frequency $2f_s$ but has the same signal band as that of the signal associated with the sampling frequency $f_s$.

To explain the doubling of the sampling frequency, reference should be made to FIG. 9. Amplitude values of coefficients from the ROM 9 are represented by alternate "." mark and "X" mark as shown at section (a) in FIG. 9. The RAM output signals 14 corresponding to the input PCM signals 1 applied to the RAM 8 and delivered out under the control of the RAM address generator 10 are illustrated in terms of amplitude of sampled value as shown at (b) and (c) in FIG. 9.

In the multiplier 16, successive coefficients marked with "." in FIG. 9(a) and successive values marked with "." in FIG. 9(b) are multiplied and in the adder 22, successive products from the multiplier 16 are added together to provide one filter output signal at a point (A).

In a similar manner, successive coefficients marked with "X" in FIG. 9(a) and successive values marked with "X" in FIG. 9(c) are processed to provide the other filter output signal at the point (A). Thus, by applying successive coefficients alternately marked with "." and "X" shown in FIG. 9(a) to the signal waveforms, a composite filter output signal associated with the doubled sampling frequency can be obtained. In other words, the successive coefficients marked with "." from the ROM 9 are switched to the successive coefficients marked with "X" therefrom, thereby ensuring doubling of the sampling frequency. The coefficients for only sampled values of an input PCM data are necessary since the multiply operation for zero is actually needed in the multiplier 16.

When the thus obtained composite filter output signal is converted into an analog signal, the low-pass filter 4a shown in FIG. 5 suffices by having such a characteristic that the signal band covering $f_s/2$ is passed and the band component covering $3f_s/2$ or more is removed, and this filter 4a can be easier to construct than the prior art filter as exemplified previously that passes the signal band covering about $f_s/2$ and blocks the band component of above about $f_s/2$.

FIG. 10 shows frequency spectra of the digital filter output signals useful for explaining the conversion of the sampling frequency in the digital filter when three PCM signals occur. Frequency spectra associated with the three PCM signals at different sampling frequencies are respectively illustrated at sections (a), (b) and (c) in FIG. 10. Characteristics of the low-pass filter necessary for the respective PCM signals are illustrated by chained lines. Thus, in the past, separate low-pass filters meeting the respective characteristics have been required.

For example, when the respective sampling frequencies associated with the respective PCM signals are converted into a sampling frequency $f_{s3}'$ according to teachings of the present invention, frequency spectra associated with the respective PCM signals are obtained as shown at (d) in FIG. 10.

In order to boost the respective sampling frequencies, $f_{s1}$, $f_{s2}$ and $f_{s3}$, up to the sampling frequency $f_{s3}'$ the ROM 9 for storage of the coefficients shown in FIG. 7 is replaced by ROMs 9a, 9b and 9c for storage of sets of coefficients which are in compliance with respective boosting ratios, as shown in FIG. 11. Addresses of these ROMs 9a, 9b and 9c are selected by ROM address signals 11a, 11b and 11c corresponding to the respective sampling frequencies associated with the respective PCM signals and generated from a ROM address generator 20.

A chained-line characteristic of the low-pass filter as shown at (d) in FIG. 10 is used in common to the respective PCM signals. In the illustrated example, the sampling frequency $f_{s3}'$ after the conversion is made equal to the highest $f_{s3}$ of the sampling frequencies associated with all the PCM signals but the converted sampling frequency may be beyond the thus set value. Further, all different sampling frequencies associated with a plurality of PCM signals are converted into the one sampling frequency $f_{s3}'$ in the illustrated example, but they may be converted into arbitrary values which are beyond the highest of the different sampling frequencies associated with the plurality of input PCM signals.

As has been described, according to the present invention, the single low-pass filter used in common to a plurality of PCM signals at different sampling frequencies suffices for attaining the desired results.

We claim:

1. A digital-to-analog converter device for processing PCM signals having different sampling frequencies, comprising:

a signal converter coupled to receive and identify one at a time in a time series a plurality of input PCM signals having different sampling frequencies, including means for converting at least a lowermost one of the sampling frequencies of the plurality of input PCM signals into a higher frequency equal to or greater than the uppermost sampling frequency of said input PCM signals and passing only signal bands of the input PCM signals and their side bands relative to the higher sampling frequency;

a digital-to-analog converter connected to receive output PCM signals from said signal converter, for converting them into analog signals; and a low-pass filter coupled to receive the analog signals from said digital-to-analog converter, including means for passing only signal bands of the analog signals and for blocking the side bands thereof.

2. A digital-to-analog converter device according to claim 1 wherein said signal converter comprises a digital filter which converts the sampling frequencies associated with the plurality of input PCM signals into the highest of the sampling frequencies or more.

3. A digital-to-analog converter device according to claim 1 wherein said signal converter comprises a digital filter which converts the sampling frequencies associated with the plurality of input PCM signals except for the highest of the sampling frequencies into a sampling frequency equal to the highest frequency and passes only signal bands of said plurality of input PCM signals, and wherein said low-pass filter has a cut-off frequency substantially equal to said highest frequency.

4. A digital-to-analog converter device according to claim 3 wherein said plurality of input PCM signals include PCM signals at sampling frequencies and a PCM signal at a sampling frequency which is higher than the former sampling frequencies, the lower sampling frequencies are converted into a frequency equal to the higher sampling frequency, and only signal bands of said input PCM signals are passed.

5. A digital-to-analog converter device according to claim 1 wherein said signal converter comprises a digital filter which doubles the respective sampling frequencies associated with the respective input PCM signals and said low-pass filter having a cut off characteristic for blocking of the side bands such that a pass-band cutoff frequency and a stop-band cutoff frequency are uniquely set for low-pass filtering of the PCM signals of different sampling frequencies.

6. A digital-to-analog converter device according to claim 1, wherein said signal converter operates as a digital filter, comprising:
store means coupled to receive an input PCM signal for sequentially storing data of the input PCM signal;
control means coupled to receive said input PCM signal for identifying the sampling frequency of the input PCM signal and generating a coefficient for converting said identified sampling frequency into said higher sampling frequency based on a predetermined specification; and
calculation means coupled to said store means and said control means for multiplying the data from said store means and said coefficient generated from said control means and for summing the result of the multiplication to produce and supply PCM signal samples of said higher sampling frequency to said digital-to-analog converter.

7. A digital-to-analog converter device according to claim 6, wherein said store means comprises a random access memory.

8. A digital-to-analog converter device according to claim 6, wherein said control means comprise at least one read-only memory.

9. A digital-to-analog converter device comprising:
a signal converter receiving a plurality of input PCM signals at different sampling frequencies, for converting at least one of the sampling frequencies associated with the plurality of input PCM signals into a higher sampling frequency and passing only signal bands of the input PCM signals;
a digital-to-analog converter connected to receive output PCM signals from said signal converter, for converting them into analog signals; and
means including a single low-pass filter, connected to receive the analog signals from said digital-to-analog converter, for passing only signal bands of the analog signals and for blocking the side bands thereof.

10. A digital-to-analog converter device according to claim 9 wherein said signal converter comprises a digital filter which converts the sampling frequencies associated with the plurality of input PCM signals into the highest of the sampling frequencies or more.

* * * * *